United States Patent [19]

Chaudhari et al.

[11] Patent Number: 5,278,140
[45] Date of Patent: Jan. 11, 1994

[54] METHOD FOR FORMING GRAIN BOUNDARY JUNCTION DEVICES USING HIGH $T_c$ SUPERCONDUCTORS

[75] Inventors: Praveen Chaudhari, Briarcliff Manor; Cheng-Chung J. Chi, Yorktown Heights, both of N.Y.; Duane B. Dimos, Montclair, N.J.; Jochen D. Mannhart, Metzingen, Fed. Rep. of Germany; Chang C. Tsuei, Chappaqua, N.Y.

[73] Assignee: International Business Machines Corporation, Armonk, N.Y.

[21] Appl. No.: 945,760

[22] Filed: Sep. 16, 1992

Related U.S. Application Data

[62] Division of Ser. No. 155,946, Feb. 16, 1988, Pat. No. 5,162,298.

[51] Int. Cl.$^5$ .................. B05D 5/12; H01B 12/00
[52] U.S. Cl. ........................ 505/1; 505/701; 505/702; 505/728; 427/62; 427/63; 427/526; 427/595; 427/596; 257/33; 257/34
[58] Field of Search ............... 505/1, 701, 702, 728; 427/62, 63, 526, 595, 596; 257/33, 34

[56] References Cited

U.S. PATENT DOCUMENTS

| | | | |
|---|---|---|---|
| 4,980,341 | 12/1990 | Gehring | 505/1 |
| 5,157,466 | 10/1992 | Char et al. | 357/5 |

OTHER PUBLICATIONS

Kobayashi et al, "Growth of high Tc superconductor films and application to new electronics", Funtai Oyobi Funmatsu Yakin, 34(10), pp. 563-566 Japan, 1987.
Tanabe et al, "Grain Boundary Josephson Junctions Using Y-Ba-Cu-O films operative at 77K", Jpn. J. Appl. Phys. 27(12) Dec. 1987 pp. L1961-L1963.

*Primary Examiner*—Roy King
*Attorney, Agent, or Firm*—Daniel P. Morris

[57] ABSTRACT

A method is disclosed for fabricating grain boundary junction devices, which comprises preparing a crystalline substrate containing at least one grain boundary therein, epitaxially depositing a high Tc superconducting layer on the substrate, patterning the superconducting layer to leave at least two superconducting regions on either side of the grain boundary and making electrical contacts to the superconducting regions so that bias currents can be produced across the grain boundary.

7 Claims, 5 Drawing Sheets

METHOD FOR FORMING GRAIN BOUNDARY JUNCTION DEVICES USING HIGH $T_c$ SUPERCONDUCTORS

This application is a division of application Ser. No. 07/155,946 filed Feb. 16, 1988, now U.S. Pat. No. 5,162,298.

BACKGROUND OF THE INVENTION

1. Field of the Invention

This invention relates to devices employing high $T_c$ superconducting materials, and more particularly to simple, practical devices employing these materials, and to methods for making these devices. The devices are planar structures employing selected grain boundaries in the high $T_c$ superconducting materials as weak link or junction barriers. Such structures are reproducibly made with good operating margins.

2. Description of the Prior Art

Recently, the remarkable discovery by J. G. Bednorz and K. A. Mueller, reported in Z. Phys. B.—Condensed Matter 64, 189 (1986) and Europhysics Letters, 3, 379 (1987) completely changed the direction and importance of superconducting technology. Their discovery was that certain metallic oxides can exhibit superconducting transition temperatures considerably in excess of 23 K. These materials are often termed "High $T_c$ Superconductors". Since the initial discoveries of Bednorz and Mueller, a vast amount of research and development has been undertaken around the world to further study these types of superconducting materials in order to extend even farther the temperature range over which the materials are superconducting, as well as to understand the basic mechanisms for superconductivity in this class of materials.

Bednorz and Mueller first showed superconducting behavior in mixed copper-oxides, typically including rare earth and/or rare earth-like elements and alkaline earth elements, for example La, Ba, Sr, ..., and having a perovskite-like structure. Materials including the so called "1-2-3" phase in the Y-Ba-Cu-O system have been found to exhibit a superconducting transition temperature in excess of 77K. R. B. Laibowitz and co-workers were the first to achieve and describe a method for making thin films of these materials. These thin film structures and methods for making them are described in co-pending application Ser. No. 027,584, filed Mar. 18, 1987, now abandoned and assigned to the present assignee. The work of Laibowitz et al is also described in Phys. Rev. B, 35, 8821 (1987). In this technique, a vapor transport process is used in which the components of the superconducting film are vaporized and deposited on a substrate in an oxygen atmosphere, after which the deposited film is further annealed.

Another paper describing thin films of these high $T_c$ superconductors, and specifically high critical currents in these materials, is P. Chaudhari et al, Phys. Rev. Lett. 58, 2864, June 1987. Chaudhari et al described epitaxial high $T_c$ superconducting films formed on substrates such as $SrTiO_3$, in which the critical current at 77 K was in excess $10^5 A/cm^2$.

Other references generally describing the deposition of films or layers of high $T_c$ superconducting materials include J. Cuomo, co-pending application Ser. No. 043,523, filed Apr. 28, 1987, now abandoned and A. Gupta, co-pending application Ser. No. 121,982, filed Nov. 18, 1987, now U.S. Pat. No. 4,997,809 assigned to the present assignee. The first of these co-pending applications describes a plasma spray coating process while the second describes a method for coating a substrate, as by spraying from solution, and then patterning the coated film to eventually produce a patterned layer of high $T_c$ superconducting material.

Epitaxy of high $T_c$ superconducting films has been accomplished on several substrates, including $SrTiO_3$. In particular, superconducting films capable of carrying high critical currents have been epitaxially deposited as noted in a paper by P. Chaudhari et al, published in Physical Review Letters, 58, 2684, June 1987.

The initial work of Bednorz and Mueller has been extended to include other copper oxide compositions which exhibit high temperature superconductivity. These other compositions typically do not include a rare earth element, but instead include an element such as Bi. A representative material is one in the system Bi-Sr-Ca-Cu-O which exhibits a drop in electrical resistance at about 115K and a transition to zero resistance at 80K. Recently, C. Michel and co-workers reported superconductivity in the non-rare earth containing BiSrCuO system with transition temperatures as high as 22K. C. Michel et al, Z. Phys. B-Condensed Matter, 68, 412 (1987). A new $BiSrCaCuO_x$ composition was then found by Maeda and Tanaker to exhibit high transition temperatures with a resistivity completion in the 80K range and a well defined resistivity decrease at about 115K. This work was reported by these authors in a preprint, which is to be published in the Japanese Journal of Physics.

The work of Maeda and Tanaker was confirmed by C. W. Chu and co-workers, and by Hazen and co-workers, these researchers noting the structure and phase identification of this bismuth-including copper oxide system. Reference is made to C. W. Chu et al, Phys. Rev. Lett., Vol. 60, pages 1174–1177 (Mar. 21, 1988).

The copper oxide superconducting materials exhibiting transition temperatures in excess of about 30° K are generally known as "high $T_c$ superconductors", and will be referred to in that manner throughout the specification. This designation is meant to include both the materials having rare earth or rare earth-like elements in their crystalline structure, as well as the more recently reported materials which do not contain rare earth or rare earth-like elements. Generally, all these materials are copper oxide based superconductors having Cu-O planes that appear to be primarily responsible for carrying the supercurrents, where the copper oxide planes are separate or in groups separated by the other elements in the compositions.

The advent of high temperature superconductivity should lead to numerous applications of junction devices operating at temperatures much high than those that have been achieved with superconducting devices fabricated from conventional superconductors. However, fabrication of workable devices has not been easy. The first such report of an operable device, in this situation a SQUID device described by R. Koch et al., utilized a film of high $T_c$ superconductor in which high energy beams were used to produce two localized constrictions to form weak link connectors between high $T_c$ superconductors. In this manner, a superconducting loop having weak link regions was created and operated successfully as a SQUID. This first high $T_c$ superconducting device and the method for making it are described in a copending patent application to G. J. Clark et al., Ser. No. 7-037,912, filed Apr. 13, 1987, now U.S. Pat. No. 5,026,682 and assigned to the present assignee.

Although it has been experimentally established that high $T_c$ superconducting copper oxides, such as $YBa_2Cu_3O_{7-x}$ can be reproducibly prepared as thin films, a well defined, all high $T_c$ single junction exhibiting Josephson tunneling currents has not been successfully fabricated. In such a device, two superconducting layers comprised of high $T_c$ superconductors are separated by a thin (10-50 angstrom) layer which operates as a tunnel barrier. An oxide material can be used for the barrier layer. However, the high $T_c$ copper oxide superconductors, whether fabricated as films or bulk samples, require annealing in an oxygen atmosphere at high temperature, typically about 900° C. This high temperature processing makes it extremely difficult if not impossible to deposit a counter electrode comprised of high $T_c$ superconducting material over the very thin insulating tunnel barrier. Generally, the high temperature processing severely degrades the junction quality. Such processing is also incompatible with most of the conventional lithographic patterning processes.

Another feature of these high $T_c$ superconducting materials is their extremely short coherence length, which is a measure of the distance over which the superconducting pairing extends. In these high $T_c$ superconductors the coherence lengths are typically 10-30 angstroms, in contrast with coherence lengths of 1000 angstroms in conventional prior art superconducting materials. Such low coherence lengths represent another technical obstacle to making either planar function or weak link type tunnel barriers in, for example, micro-bridge Josephson junction devices. In weak link devices, a very narrow constriction operates as a weak link barrier between two large superconducting regions to provide Josephson-like characteristics. However, because the coherence length is so small in high $T_c$ superconductors, the geometrical constriction must have a dimension of the order of the coherence length in order to exhibit weak-link characteristics. Such narrow constrictions cannot be reliably produced. When planar junctions are formed, it is also very difficult to reliably deposit tunnel barrier layers having thicknesses of the order of the coherence length (about 10 angstroms) of high $T_c$ superconductors.

Accordingly, it is a primary object of the present invention to provide a practical device employing high $T_c$ superconducting materials where the aforementioned problems are avoided.

It is another object of the present invention to provide a method for reproducibly making practical junction and weak link superconducting devices employing only high $T_c$ superconducting materials.

It is another object of this invention to provide a device and method for making the device employing high $T_c$ superconducting materials in a planar configuration wherein the weak link or junction region can be precisely located with a defined orientation.

In the practice of this invention, junction devices or weak link devices are fabricated using a grain boundary between two high $T_c$ superconducting grains. These grain boundaries are very narrow (about the order of the unit cell in the materials, i.e., about 10 angstroms) and their electrical properties (such as resistance) can be readily varied to provide different device properties. In particular, a planar structure is provided utilizing an epitaxial film of high $T_c$ superconducting material deposited on a substrate having defined and predetermined grain boundaries therein. In this manner, the grain boundaries in the substrate are reproducibly formed in the epitaxial superconductor film. Stated another way, epitaxy maps the polycrystalline structure of the substrate into the high $T_c$ superconductor film.

It is recognized that grain boundaries have been used to provide potential barriers for the flow of electrons thereacross in prior superconducting devices. Such devices have been called boundary layer Josephson junctions and have been described in the following references:

M. Ito et al, Japanese Journal of Appl. Physics, 21, No. 6, pp. L375-376, June 1982.

M. Ito et al, Appl. Phys. Lett., 43, (3) p. 314, August 1983.

T. Inamura et al, Jap. Journal of Appl. Phys., 21, Supplement 21-1, pp. 313-318, 1982.

The devices described in these references use the grain boundaries that randomly occur when a superconductor film is deposited on a substrate. These superconductors are generally designated BPB films because they are comprised of Ba, Pb, and Bi oxide combinations having a perovskite-type structure. These references do not teach a way to controllably make grain boundary junction devices whose characteristics can be well controlled and which can be reproducibly formed with uniform properties. As noted, these references describe devices in which a random formation of randomly oriented grains occurs in materials having low transition temperatures of about 13K.

In further contrast with these and other references, the devices of the present invention are made in an epitaxial layer of high $T_c$ superconducting material. Generally, epitaxy is thought of with respect to single crystal material rather than polycrystalline materials of the type used for the substrate and the superconducting film in the devices of this invention.

M. Suzuki et al describes the formation of planar Josephson-type devices using crystalline layers of BPB in J. Appl. Phys. 53, (3), p. 1622, March 1982. In this structure, two superconducting layers of BPB are separated by an insulating tunnel barrier comprised of an insulating oxide having the same crystal structure as BPB. Such device structures have not been possible using high $T_c$ superconducting materials, for the reasons described above with respect to the high temperature processing and very short coherence length in these new superconductors.

Accordingly, it is another object of the present invention to provide practical devices utilizing selected grain boundaries in high $T_c$ superconducting materials.

It is another object of this invention to provide processing techniques for reproducibly making grain boundary superconductive devices employing high $T_c$ superconducting materials, wherein the device properties are uniform and wherein the device structures are planar and easily and reproducibly fabricated.

It is another object of this invention to provide improved devices employing high $T_c$ superconductors, wherein the design of such devices and the techniques for making them effectively utilize features found in nature which may otherwise be considered obstacles.

BRIEF SUMMARY OF THE INVENTION

This invention relates to improved devices utilizing high $T_c$ superconducting materials and uniform, reproducibly created grain boundaries in such films for the fabrication of the devices. It is recognized that grain boundaries have been utilized in the prior art as tunnel barriers in the work relating to BPB oxides, and that the possible presence of grain boundaries leading to Josephson tunneling currents was mentioned in the copending application to G. J. Clark et al, Ser. No. 037,912. However, the present invention seeks to provide devices and methods for producing these devices which are controllable and reproducible to define grain boundary devices in high $T_c$ Josephson materials having small coherence lengths. Further, the location, orientation, and number of these new grain boundary devices can be predetermined and the properties of each of the devices can be adjusted during fabrication.

In a preferred embodiment, a substrate is prepared having at least one grain boundary therein, which grain boundary is to be reproduced in an overlying layer of high $T_c$ superconductor. The layer of high $T_c$ superconductor is then epitaxially deposited on the substrate in order to reproduce in the superconducting layer the grain boundary present in the substrate. This defines the location and orientation of the grain boundary in a controlled manner. After this, the superconducting film is patterned to leave at least one superconducting region on each side of the grain boundary, these superconducting regions being used as electrodes for current flow across the grain boundary. High energy beams or excimer laser ablation can be used to define the superconducting regions that are to function as the electrodes for these superconducting devices. After this, the superconducting regions are electrically contacted and appropriately biased to have current flow across the grain boundary which functions as a potential barrier. A plurality of devices of this type can be arranged in any manner to produce an array of such devices, a SQUID, etc.

These and other objects, features, and advantages will be apparent from the following more particular description of the preferred embodiments.

BRIEF DESCRIPTION OF THE DRAWINGS

FIG. 8 is a plot of critical current $I_c$ versus temperature for the three regions I, II, and III, while FIGS. 9A-9C illustrate plots of critical current $I_c$ versus applied magnetic field H for the three regions I, II, III, respectively.

DESCRIPTION OF THE PREFERRED EMBODIMENTS

In the practice of this invention, superconducting devices comprised of a single layer of high $T_c$ superconducting material can be made in a planar geometry utilizing grain boundaries for tunnel barriers or weak link connections between superconducting grains. In contrast with the prior art, this can be done reproducibly and controllably since the grain boundaries can be produced in the superconducting layers in a manner in which the orientation and location of the grain boundary are predetermined.

The general process steps include the preparation of the substrate having at least one grain boundary defined therein with respect to the orientation and location of the grain boundary. After this, a high $T_c$ superconducting layer is epitaxially deposited on the substrate (or on a thin interface layer epitaxially grown on the substrate) in order to produce in the superconducting layer a grain boundary corresponding in location and orientation to the grain boundary in the underlying substrate. After this, the superconducting layer is patterned to leave regions of superconducting material on either side of the grain boundary in order to produce a device having superconducting regions (electrodes) separated by the grain boundary. Electrical contacts can then be made to the superconducting regions for connection to appropriate biasing sources. As will be seen, the properties of the grain boundary can be adjusted and multiple devices can be fabricated along a single grain boundary or along several grain boundaries.

Figure 1:
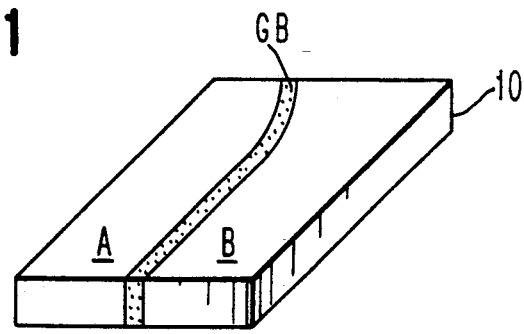
FIGS. 1, 2, 3 and 4 schematically illustrate a process wherein a grain boundary device is fabricated in an epitaxial layer of high $T_c$ superconducting material.

Referring more particularly now to FIGS. 1-4, the general technique for producing a planar grain boundary device is illustrated. In this technique, there is no subsequent processing step which would interefere with the material properties of any of the component parts of the device, and the structure that is obtained is planar. The grain boundary functions as a Josephson tunneling barrier or weak link connection, and is typically about 10 angstroms in width in these high $T_c$ superconducting materials. More generally, the grain boundary width is of the order of the unit cell of these high $T_c$ superconductors. In FIG. 1, substrate 10 includes two single crystal grains A and B separated by a grain boundary GB. This grain boundary is approximately 10 angstroms in width and is schematically illustrated by the stipled region between the crystalline grains A and B.

Figure 2:
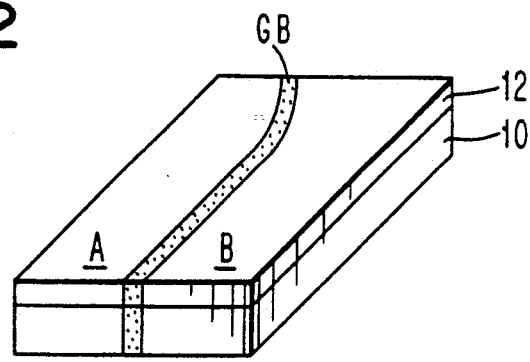

In FIG. 2, a layer 12 high $T_c$ superconducting material has been epitaxially deposited on the substrate 10 using, for example, known techniques. These techniques include vapor deposition as by evaporation or sputtering from multisources as described in the aforementioned articles and copending patent applications in the names of R. B. Laibowitz, P. Chaudhari and others. Because the superconducting layer 12 is epitaxially formed on the substrate 10, it will have crystalline regions A and B coextensive with those in the substrate 10, and a grain boundary GB having the same orientation and location as the grain boundary in the underlying substrate 10.

Figure 3:
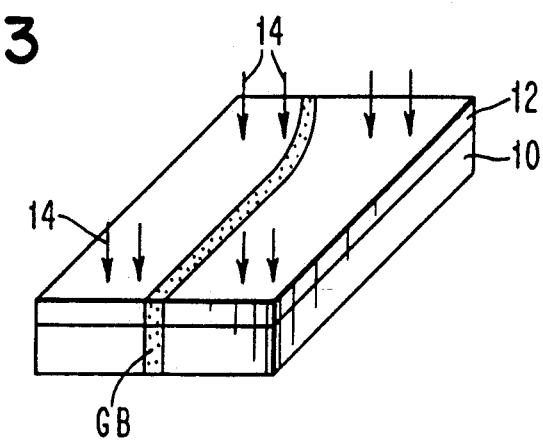

In FIG. 3, the superconducting layer 12 is patterned, for example by using photons or high energy particles, represented by the arrows 14. This patterning can be done in a variety of ways, and is used to define regions of the superconducting layer 12 which are to be left in their superconducting state while the irradiated portions are either physically removed or converted to a nonsuperconducting (i.e., normal) state. In order to render an irradiated region nonsuperconducting, the technique described by G. J. Clark et al in aforementioned copending application Ser. No. 037,912 can be used. This technique is more fully described in two publications by G. J. Clark et al, appearing in Appl. Phys. Lett. 51, (1987) at pages 139 and 1462, and comprises the use of high energy beams to cause damage in high $T_c$ superconducting materials. This damage can change the properties of the material from superconducting to normal and even to a nonsuperconducting insulating state having an amorphous structure. Examples of high energy beams that can be used for this purpose are directed ion beams comprising ions such as oxygen, As, Kr, etc. The ion beam can be directed to selected areas of the superconducting layer through the use of a mask. An example of a SQUID device made by this technique is described in R. H. Koch et al, Appl. Phys. Lett., 51, p. 200 (1987).

High energy beams providing energies in the range of about 250 KeV—2 or 3 meV will typically provide enough damage to alter the properties of high $T_c$ copper oxide superconductors. However, it is within the practice of this invention that patterning can be accomplished by energy beam irradiation where the superconducting material is not totally converted to a nonsuperconducting state, but rather has its critical transition temperature $T_c$ lowered appreciably with respect to the nonirradiated regions of the superconducting layer.

Another technique for patterning high $T_c$ superconducting layers is the use of excimer ablative photodecomposition in which ultraviolet radiation impinges on the superconducting layer to ablate (i.e., blow away) the irradiated regions. Ablative photodecomposition will occur if the energy fluence of the UV radiation is sufficiently high that the threshold for ablative photodecomposition is exceeded. In this process, the ablation occurs with substantially no thermal effect to the surrounding nonirradiated regions. This is a particularly good technique, as the surrounding regions will have the same superconducting properties after patterning has occured.

Figure 4:
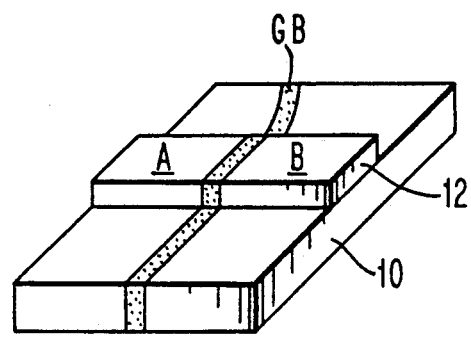

FIG. 4 illustrates the structure that remains after patterning. Here, a thin strip of the superconductor 12 is left on the substrate 10, the superconductor 12 including grains A and B separated by the grain boundary GB in the superconducting material. As is apparent, it is a planar structure wherein grains A and B can be used for electrical contacts, the current flow being substantially normal to the plane of the grain boundary.

Thus, the general steps of this process include the provision of a substrate having at least one grain boundary therein whose location and crystal orientation are predetermined, the epitaxial deposition of a layer of high $T_c$ superconducting film on the substrate to establish in the superconducting film a grain boundary corresponding to that in the substrate, patterning of the superconductor to leave superconducting regions separated by a portion of the grain boundary, and contacting the superconducting regions with the appropriate electrical sources. One example of the final structure is shown in FIG. 5.

Figure 5:
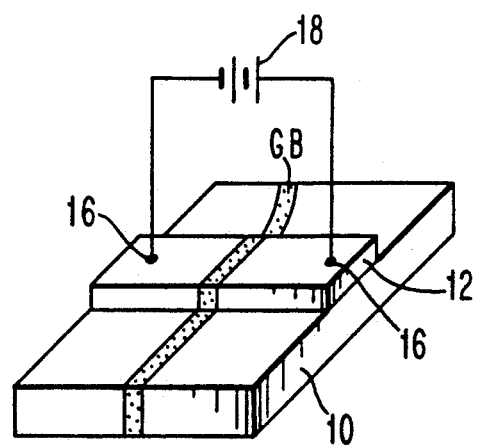
FIG. 5 schematically illustrates electrical connections to the device produced by the technique illustrated in FIGS. 1-4.

In FIG. 5, electrical contacts 16 are made to superconducting grains A and B and a bias source, represented by battery 18 is attached thereto for providing a current flow across the grain boundary GB in the superconducting layer.

The substrate materials are selected from those materials on which an epitaxial layer of high $T_c$ superconducting film can be deposited. Examples of suitable substrates include $SrTiO_3$ substrates for epitaxial deposition thereon of high $T_c$ superconducting materials such as $YBa_2Cu_3O_{7-x}$. Other suitable substrates will be apparent to those of skill in the art, the substrates being generally chosen to have sufficient lattice match with the desired high $T_c$ superconducting material that the superconducting material can be epitaxially deposited thereon.

Techniques exist in the art for providing substrates having controlled grain boundary growth. For example, a grain boundary with a controlled misorientation can be obtained by forming a bicrystal from two oriented single crystals. The bicrystal is grown by sintering two single crystal pieces in a powder compact. During sintering, the single crystal pieces grow at the expense of the smaller surrounding grains until the single crystals impinge on each other to form a single grain boundary. This technique has been used to form the bicrystal of $SrTiO_3$ at a sintering temperature of 1600° C. Alternatively, a bicrystal can be formed by hot pressing two single crystal pieces together. While both techniques can be used to form a long, well-defined grain boundary, the advantage of the second method is the ability to form a straight grain boundary that is free of pores.

As was described, the grain boundary forms a tunneling barrier or weak link between the superconducting grains to which electrical contact is made. The critical current density and tunneling characteristics of the grain boundary can also be modified with a low temperature (less than 400° C.) annealing step in a controlled gas atmosphere. Both inert and reducing gasses, such as He and Ar, as well as reactive gasses such as $CO_2$ are effective for this purpose. An inert gas annealing step acts to reduce the oxygen content of the superconductor film. A $CO_2$ anneal will promote the formation of $BaCO_3$ in a film of $YBa_2Cu_3O_{7-x}$, where $BaCO_3$ is an insulator. Since the activation energies for diffusion and solid state reaction of grain boundaries are typically lower than for the rest of the lattice, an optimum set of annealing temperatures and times exist for which the transition temperature $T_c$ and normal state resistivity of the grain boundary are altered while leaving the corresponding properties of the adjacent superconducting grains relatively unaffected.

EXAMPLES (FIG. 6-9C)

The principles of this invention were demonstrated by the fabrication of several Josephson junctions using a grain boundary in the high $T_c$ superconductor $YBa_2Cu_3O_{7-x}$. For this, a polycrystalline layer of high $T_c$ superconductor having a large grain size in the plane of the film was fabricated. This superconducting material was epitaxially grown on a substrate of $SrTiO_3$. Several substrates of polycrystalline $SrTiO_3$, having grains as large as 200–300 microns, were used on which the YBaCuO superconducting films were deposited.

These large grain $SrTiO_3$ substrates were prepared by sintering cold-pressed pellets of fine-grained powder (average grain size approximately 2.5 microns) in air at temperatures in the range 1600°–1650° C., for at least 48 hours. These sintering conditions cause exaggerated grain growth to occur, which leads to the formation of very large grains in the dense pellets ($p/p_{th} \geq 99\%$). The strontium titanate powder was prepared by reacting high purity powders of strontium carbonate and titanium dioxide at 1450° C. until a single phase material is obtained.

Figure 6:
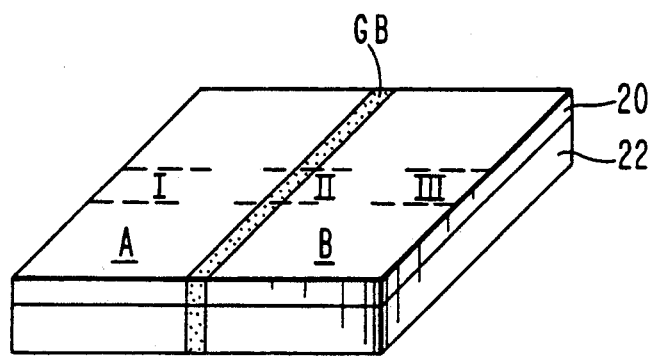
FIG. 6 is a schematic illustration of a layer of high $T_c$ superconducting material having two grains A and B separated by a grain boundary. Regions I, II, and III are defined by the dashed lines.

To fabricate a single Josephson junction containing a well defined grain boundary as the weak-link bridge, high $T_c$ $YBa_2Cu_3O_{7-x}$ films were epitaxially deposited onto the large grain polycrystalline $SrTiO_3$ substrates. The details of superconductor film deposition and post deposition annealing are those which have been described previously by R. B. Laibowitz, P. Chaudhari, et al. After this annealing step the superconducting films were epitaxially aligned with the grain orientation of the substrate, resulting in a large-grained superconducting film. This is illustrated in FIG. 6 where the superconducting film 20 is epitaxially aligned with the substrate 22. Large grains A and B are produced in the superconducting film 20, where the grains are separated by the grain boundary GB.

Figure 7:
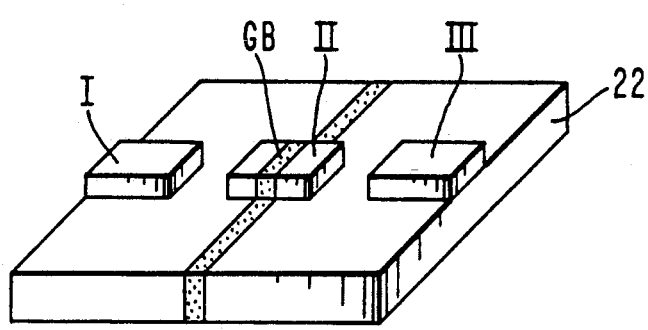
FIG. 7 is an illustration of the layer of high $T_c$ superconducting material shown in FIG. 6, where different regions I, II and III have been processed in grains A and B to illustrate the invention.

In order to define the geometry and dimensions of a grain boundary junction device and its electrode pads, the technique of laser ablation was used. Grains A and B were patterned by excimer laser ablation as described hereinabove in order to make 3 lines I, II, and III, as illustrated in FIG. 7. In these examples, the substrate-superconducting film combination was mounted into a computer controlled stepping stage and irradiated with a demagnified image of variable size rectangular aperture. This technique can be used to pattern high $T_c$ superconducting films in dimensions ranging from several centimeters in length to submicron dimensions in width without any degradation in critical temperature $T_c$ and critical current density $J_c$.

In these examples, three narrow lines I, II, III having dimensions of about 20 microns $\times$ 80 microns $\times$ 0.5 microns thickness were patterned in superconducting film 20. This step removed the superconducting materials in the irradiated regions. The structure produced is shown in FIG. 7 where line I is totally in grain A, while line III is totally in grain B. However, line II straddles the grain boundary GB. In laboratory demonstrations, the width of the lines was varied from approximately 1 micron to approximately 2 microns. The length of the line within a grain was approximately 40 microns while the length of the line crossing the grain boundary was varied between 2 and 40 microns.

Figure 8:
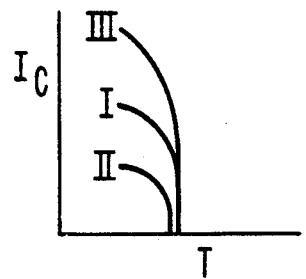
FIGS. 8, and 9A, 9B and 9C illustrate electrical properties of the regions I, II, and III shown in FIG. 7. More particularly.

The electrical characteristics of the 3 lines I, II, and III are shown in FIGS. 8 and 9A-9C. In FIG. 8 the critical current $I_c$ is plotted against temperature for current flow in each of the three lines I, II and III. From this FIG. it is apparent that line II, containing a grain boundary, always has a lower critical current than that lines I and III.

Figure 9A:
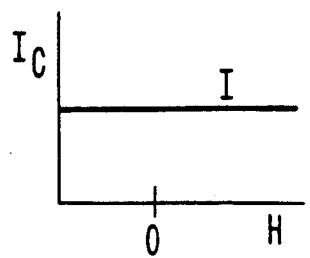
Figure 9B:
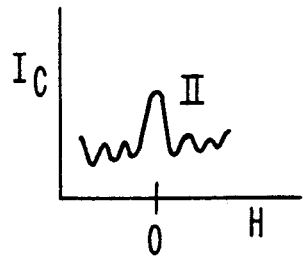
Figure 9C:
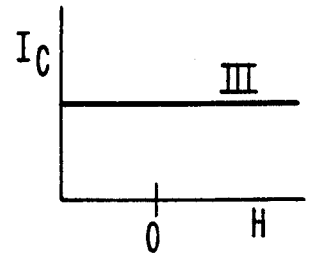

FIGS. 9A-9C more dramatically illustrate the essential features of a Josephson weak link junction in line II, in contrast with lines I and III. These FIGS. plot critical current $I_c$ versus applied magnetic field H for each of the three lines I, II and III. The plots in FIGS. 9A and 9C are similar, while the plot in FIG. 9B clearly illustrates the presence of the grain boundary junction in line II. The junction resistance here is of the order of a few ohms and its capacitance is estimated to be a fraction of 1 picofarad. The Stewart McCumber parameter is of the order of 1 for these samples. Therefore, the hysterises in the I-V curves for these samples is quite small, in sharp contrast to the conventional overlap junctions with higher capacitance made by separating two superconducting layers with an insulating layer of, for example, an oxide material.

In the practice of the present invention, the number of grain boundaries, their orientations and their locations in the superconducting layer are known in advance of patterning for device formation. This is a major distinction over the randomness with respect to location and orientation of prior art grain boundary devices using other types of superconductors. Another major distinction is with respect to the superconducting grain size that is used in the present invention in contrast with that of prior art grain boundary devices. In the present invention, the grain sizes are typically hundreds of microns in contrast with an average of about 10 microns grain size for prior art devices. Because the grains in the present invention are very large, it is easy to isolate grain boundaries for patterning and formation of devices. This cannot be achieved in the prior art where the grain boundaries are extremely short and randomly oriented.

Another advantage of the present devices in contrast with prior art grain boundary devices relates to the unformity of properties along the grain boundaries. In the present invention, long grain boundaries can be produced so that the same grain boundary can be used when patterning several devices, or an array of devices. Since the use of the same grain boundary as a barrier in more than one device helps to ensure the uniformity of individual device properties, the quality of circuits and arrays produced from devices made in accordance with the present invention can be significantly greater than those using prior art structures. For example, in a SQUID device, a superconducting loop is formed including at least 2 weak links or tunnel barriers. In the present invention, it is possible to construct the superconducting loop in such a way that multiple tunnel barriers are formed using the same grain boundary in order to make all the weak link devices in the superconducting loop have essentially identical properties. This cannot be achieved in prior art structures utilizing several grain boundaries.

SQUID DEVICES

Figure 10A:
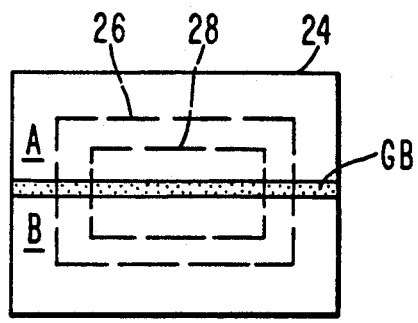
FIGS. 10A and 10B illustrate a process for fabricating a SQUID comprised of 2 grain boundary devices in a superconducting loop of high $T_c$ superconducting material.
Figure 10B:
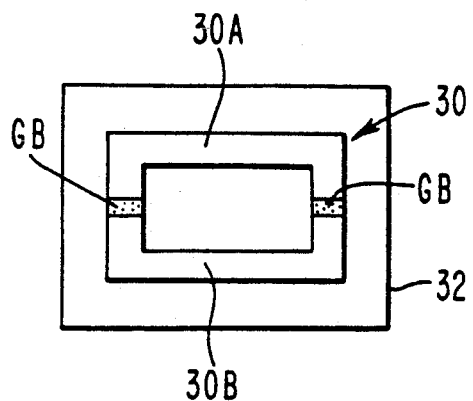
Figure 11:
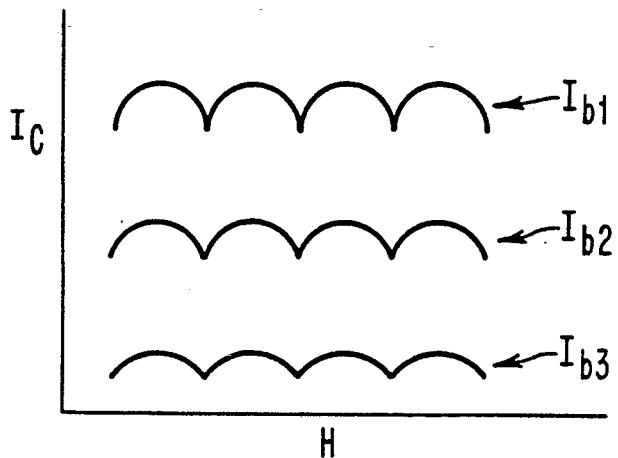
FIG. 11 is a plot of critical current $I_c$ versus applied magnetic field H for the SQUID illustrated in FIG. 10B, for three different bias currents.

FIGS. 10A and 10B illustrate a SQUID device that was prepared in accordance with the present invention, while FIG. 11 is a plot of critical current $I_c$ versus applied magnetic field H, for different values of bias current through the SQUID. This plot was made at 4.6 K., although the same general characteristics are obtained at temperatures above 77 K.

FIG. 10A is a top view of a superconducting layer 24 (on a substrate not shown in this view) having a single grain boundary GB therein separating the superconducting grains A and B. The dashed lines 26 and 28 define the boundaries of the superconducting loop that is to be formed for the SQUID device. Regions of the superconducting layer outside dashed line 26 and inside dashed line 28 were removed by laser ablation to leave a loop of superconducting material 30 (FIG. 10B). This superconducting loop is located on the substrate 32, and includes a first portion 30A and a second portion 30B separated by two grain boundary regions GB. Thus, two tunnel barrier or weak link devices are formed in the superconducting loop 30, thereby producing the SQUID.

FIG. 11 shows the response of the SQUID of FIG. 10B to an applied magnetic field, and is based on measurements made of the device. A current was produced in the superconducting loop and a magnetic field H was applied parallel to the plane of the grain boundaries and perpendicular to the plane of the superconducting layer 24. FIG. 11 shows the interferometer response of the SQUID of FIG. 10B to the applied magnetic flux for three values of bias current $I_b$, $I_{b2}$, $I_{b3}$ through the SQUID loop. The precise periodicity and the large modulation depth as a function of magnetic field clearly demonstrates the usefulness of these grain boundary junctions in the fabrication of devices, such as the SQUID of FIG. 10B.

In addition, the small $B_c(<1)$ for these grain boundary junctions eliminates the need for an external resistance shunt to achieve nonhysteretic SQUID operation.

A planar spiral coupling coil comprised of all high $T_c$ superconducting materials can be made on a separate chip. After individual testing of the coil, the coil and the SQUID of FIG. 10B can be positioned to achieve optimum coupling of magnetic fields from the coil to the SQUID. This provides a device with enhanced sensitivity and reproducibility.

What has been described herein are devices based on the first direct measurements of the critical current of a number of grain boundaries and of their adjoining superconducting grains. The critical current of the boundaries is less than that of the adjoining grains, while the temperature and magnetic field dependence of the critical currents of the grain boundaries indicate that the boundaries are comprised of regions of weak and strong coupling. The grain boundaries can be used to form structures such as SQUIDS and provide a natural way to develop more advanced tunneling structures that can be used for scientific or practical applications.

The structures of this invention can be used to provide enhanced devices for many purposes, including infrared sensors and coherent arrays for detection and transmission of millimeter waves and linear junction arrays for voltage standards. For example, a coherent array can be fabricated from a number of tunnel devices formed using the same grain boundary as the tunnel barrier or weak link barrier in each device. Since each device can be made very small and have the same properties with respect to the superconducting grains and the grain boundary that is used as the tunnel barrier, coherent arrays having enhanced properties can be envisioned. Further, since the location and orientation of the grain boundaries can be precisely controlled, design layouts for a plurality of these devices are easily realized.

While the invention has been described with respect to particular embodiments thereof, it will be appearant to those of skill in the art that variations may be made therein without departing from the spirit and scope of the present invention. In this regard, the invention is specifically directed to devices and methods using controlled imperfections (such as grain boundaries) in a superconducting layer where the superconducting layer is preferably a high $T_c$ superconductor of the type exhibiting a crystalline structure including copper oxide planes.

Having thus described our invention what we claim as new and desire to secure as Letters Patent, is:

1. A method for making a barrier device of high $T_c$ superconducting material, comprising the steps of:
   providing a crystalline substrate having a grain boundary therein,
   epitaxially depositing a layer of said high $T_c$ superconducting material on said substrate to map said grain boundary into said superconducting layer from said substrate,
   patterning said layer of said superconducting material to produce high $T_c$ superconducting regions therein on each side of said grain boundary, and
   electrically connecting each said high $T_c$ superconducting regions to an electrical source for producing current flow between said regions across said grain boundary.

2. The method of claim 1, where said patterning destroys superconductivity in regions of said layer of said high $T_c$ superconducting material.

3. The method of claim 1, wherein said superconducting material is a copper oxide material exhibiting superconductivity at temperatures greater than 77 K.

4. The method of claim 1, where said patterning step produces at least two high $T_c$ superconducting regions on each side of said grain boundary.

5. The method of claim 4, where said at least two high $T_c$ superconducting regions are connected to form a loop of said high $T_c$ superconducting material having said grain boundary therein.

6. The method of claim 1, where said patterning step produces multiple pairs of superconducting regions straddling said grain boundary.

7. The method of claim 6, where at least two of said pairs of superconducting regions are connected to form a superconducting loop broken by said grain boundary.

* * * * *